INVENTOR.
HANS G. DILL,
BY John M. Koch
ATTORNEY

INVENTOR.
HANS G. DILL,
BY John M. Koch
ATTORNEY.

United States Patent Office 3,414,781

Patented Dec. 3, 1968

3,414,781

FIELD EFFECT TRANSISTOR HAVING INTERDIGITATED SOURCE AND DRAIN AND OVERLYING, INSULATED GATE

Hans G. Dill, Costa Mesa, Calif., assignor to Hughes Aircraft Company, Culver City, Calif., a corporation of Delaware

Filed Jan. 22, 1965, Ser. No. 427,264
10 Claims. (Cl. 317—235)

This invention relates to a metal-oxide-semiconductor field effect transistor employing an interdigitated source-drain structure with a total surface gate arrangement.

Metal-oxide-semiconductor field effect transistors show great promise for applications in the electronics industry because of their pentode characteristics and their use of an insulated gate with a high input impedance permitting direct current coupling between multiple transistor stages. A considerable amount of research and development effort is being directed toward the solution of noise and stability problems which are created by surface conditions, especially in the gate region of these field effect transistors. In addition to these problems, it is necessary to simplify the fabrication processes for these field effect transistors so that they can compete successfully with equivalent prior art devices, such as vacuum tubes and bipolar transistors. One of the primary fabrication problems encountered in producing these transistors is that of precise location of the metal gate film relative to the channel region in the fabricated structure. If the metal gate film is too wide relative to the channel region in the transistor, additional stray capacitance is developed which reduces the frequency response of the transistor. On the other hand, if the metal gate film is too small relative to the channel region in the transistor, and does not cover the entire channel area, additional ohmic losses are introduced into the transistor and low transconductance may result.

Accordingly, it is a primary object of this invention to solve the fabrication problems encountered in the production of these field effect transistors by placing the metal film gate over the entire area of a plurality of interdigitated source-drain fingers.

An arrangement of this type in these transistors is characterized by having a moderate frequency response and certain stability problems as a voltage amplifier (Miller effect) but the power capabilities thereof are excellent. Transistors of this type are useful as final power amplifiers having little voltage gain. They operate up to 10 megacycles and have power dissipation in the watt range.

The metal-oxide-semiconductor field effect transistor operates upon the same principle as the junction field effect transistor. It uses a gate electrode separated by an insulator rather than the depletion layer of a reverse-biased junction. A more detailed description of specific embodiments of the invention is given below with reference to the appended drawings, wherein.

The basic structure and fabrication process that can be used to produce the metal-oxide-semiconductor field effect transistor of the invention is described with reference to FIGS. 1 to 5, for an N channel device. First a layer 10 of silicon dioxide of about one micron thickness is grown upon a chip 11 of P silicon.

Figure 1:
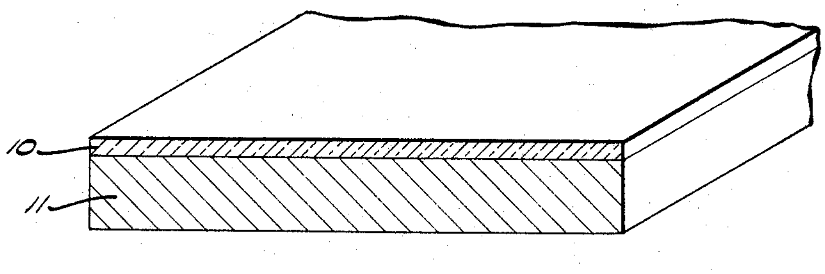
FIGS. 1 to 4 are schematic isometric, sectional views representing fabrication steps showing a fabrication method for the metal-oxide-semiconductor field effect transistor of the invention.
Figure 2:
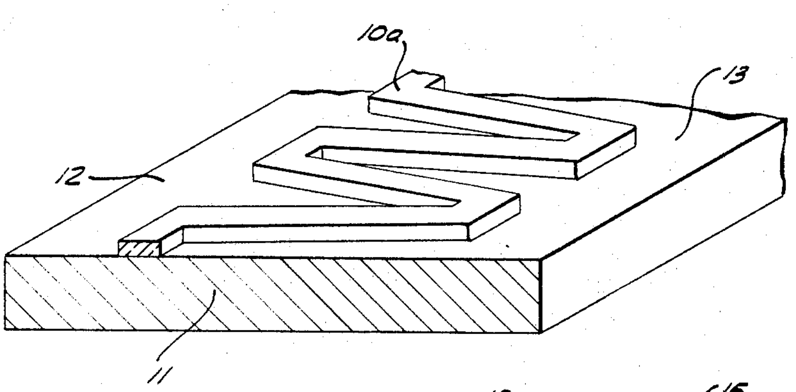
Figure 3:
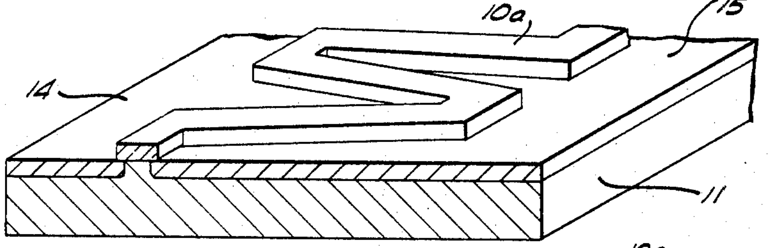
Figures 4, 5:
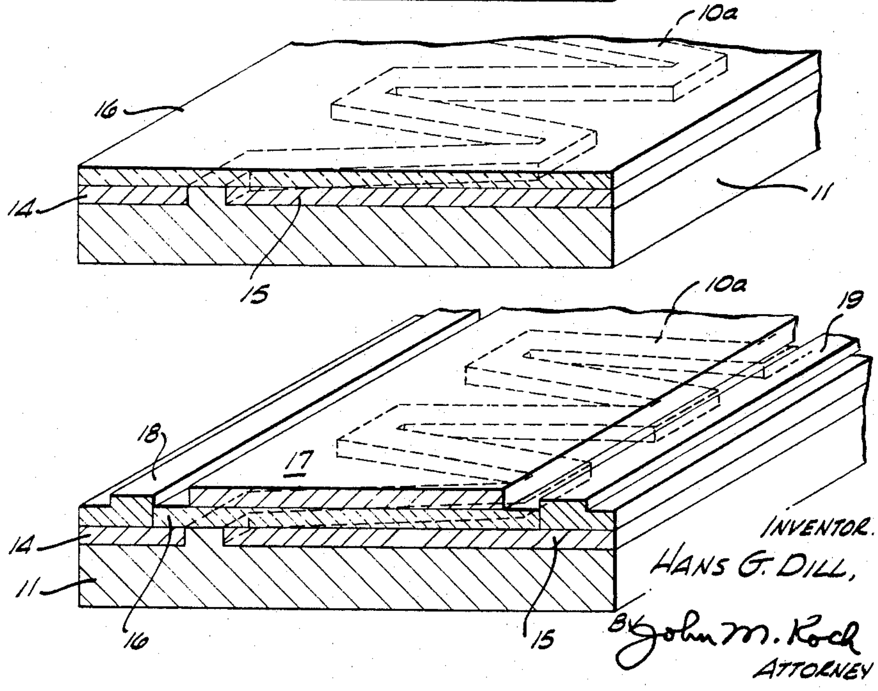
FIG. 5 is a schematic isometric view showing a fabricated metal-oxide-semiconductor field effect transistor of the invention.

A source area 12, a drain area 13 and a silicon dioxide contour mask 10*a* are formed on P silicon chip 11 with the aid of a suitable etching solution and mask, as shown in FIG. 2. A source area 14 and a drain area 15 are formed on P silicon chip 11, as shown in FIG. 3, by conducting an N+ diffusion operation. A silicon dioxide layer 16 then is grown over source area 14 and drain area 15 and around silicon dioxide contour mask 10*a*, as shown in FIG. 4. Finally, a metal gate film 17 is deposited over the entire area of the interdigitated source-drain fingers 14 and 15, as shown in FIG. 5. The metal-oxide-semiconductor field effect transistor structure is completed by etching contact apertures and depositing ohmic metal contacts as shown in FIG. 5 at 18 and 19, to source area 14 and drain area 15, respectively.

In accordance with the present invention, major problems discussed hereinabove, relative to prior art transistors, are solved by the provision of an interdigitated source-drain metal-oxide-semiconductor field effect transistor with a total surface gate. The principle of this transistor is based upon the fact that prior art technology makes it impossible to place the gate exactly over the channel area. In accordance with the transistor of this invention, the gate covers an interdigitated source-drain structure as shown in FIG. 5, where the source is shown at 14, the drain at 15 and the gate at 17.

Figure 6:
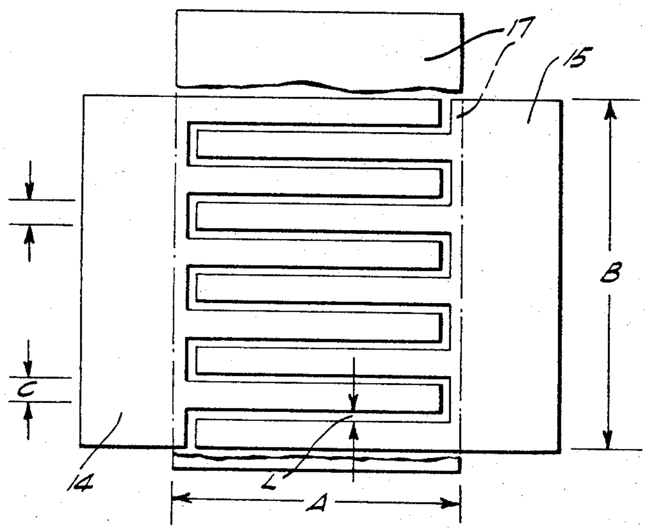
FIG. 6 is a schematic plan view showing a thin film metal-oxide-semiconductor field effect transistor structure of this invention wherein the continuous gate covers an interdigitated source-drain structure.

Among the advantages of this construction, of the transistor of this invention, are included the fact that no masking tolerance problems are involved, and a large channel area permits a transistor design for high power dissipation. Some frequency response sacrifices are made and some ohmic losses are suffered in the source 14 and drain 15 fingers by this construction, due to the sheet resistance of the diffused N+ layer. As a compromise, however, in the transistor structure of this invention, as shown in plan view in FIG. 6, the width C of the drain and the source fingers is chosen so as to keep the source 14 and drain 15 series resistance $R_{ss}$ and $R_{sd}$, and the gate 17 stray capacitances $C_{gd}$ and $C_{gs}$ to a minimum. The transconductance $g_m$ derived from FIG. 6 is:

$$g_m=\frac{\epsilon_0\epsilon\mu^{WV_G}}{tL} \text{ (neglecting surface states)} \quad (2)$$

$$g_m=\frac{\epsilon_0\epsilon\mu^{ABV_G}}{tL(C+L)} \quad (3)$$

The gain bandwidth product of a single stage driven from a voltage source is:

$$(A\Delta f)_s=\frac{g_m}{2\pi(C_{gd}+C_{sd})} \quad (4)$$

Because of the total coverage of the gate 24, $$C_{gd}=C_{gs}<C_{sd}$$

and Equation 4 simplifies to:

$$(A\Delta f)_s=\frac{g_m}{2\pi C_{gd}} \quad (5)$$

or, from FIG. 5:

$$(A\Delta f)_s=\frac{\mu}{\pi L^2}\frac{C_g}{C_g'}V_G \quad (6)$$

$$(A\Delta f)=\frac{\mu}{\pi L^2}\frac{L}{C+L}V_G=\frac{\mu}{\pi L(L+C)}V_G \quad (7)$$

Equation 7 shows that the gain bandwidth product is independent of the surface area. This permits the design of power transistors with a good frequency response. If it is desired to keep $g_m$ constant, the gate insulation layer thickness $t$ must be increased proportionally with the gate area AB. In general, a thick gate insulation layer is desirable ($0.1\mu<t<2\mu$) because it permits a large input voltage swing, which is used in power amplifiers, and gives greater material reliability.

Figure 7:
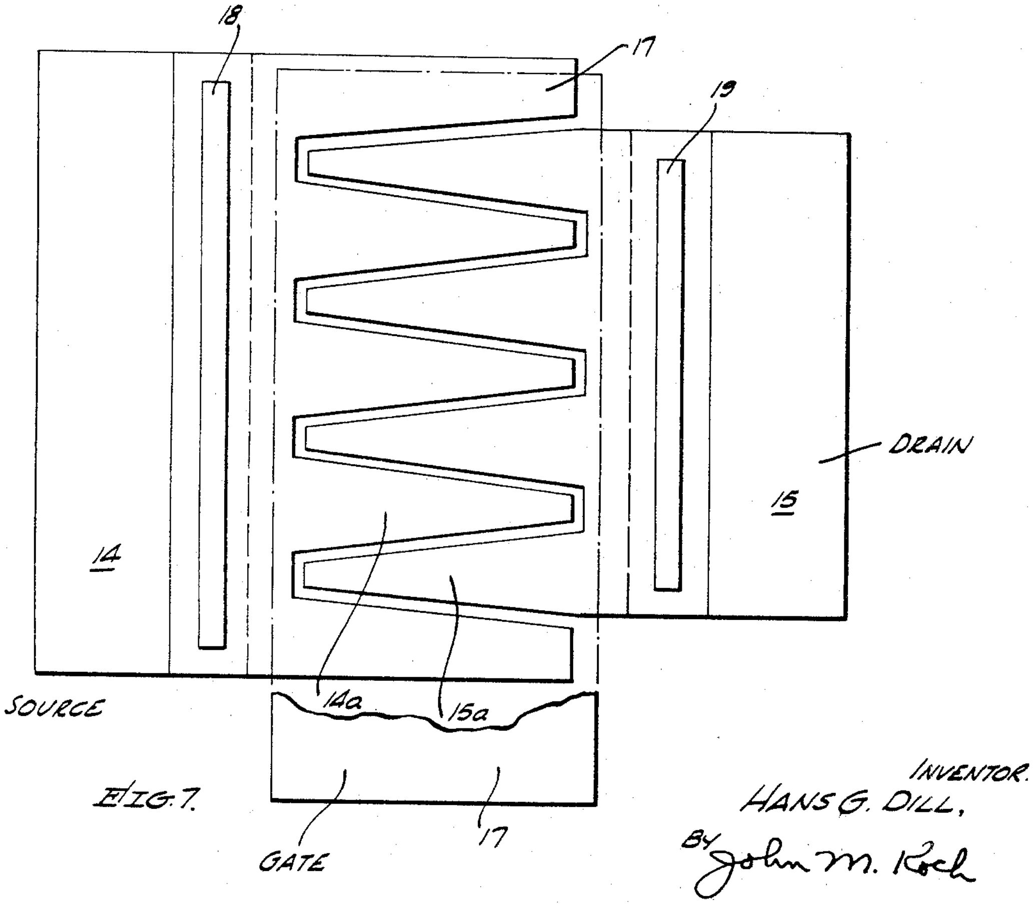
FIG. 7 is a similar view showing a practical device employing the structure shown in FIG. 5.

A practical metal-oxide-semiconductor field effect transistor, in accordance with the invention, is shown in FIG. 7 in plan view. Source fingers **14*a* are part of source 14 and drain fingers 15*a* are part of drain 15. Source fingers 14*a* and drain fingers 15*a* are tapered to minimize the loss resistance $R_{ss}$ and $R_{sd}$. With the relatively heavy interdigitated fingers 14*a* and 15*a***, the gain bandwidth product is still 30 mc. With thinner interdigitated source and drain fingers, the gain bandwidth product could be increased to 50 mc. at the expense of a larger drain and source series resistance. The transistor of the invention shown in FIG. 7 also demonstrates that interdigitated devices of this type provide high transconductance and high power dissipation on a very small surface area.

It will be understood that, although a P silicon chip 11 with N+ source 14 and N+ drain 15 were used above in describing an embodiment of the metal-oxide-semiconductor field effect transistor of the invention, an N silicon chip with P+ source and P+ drain can be used. Also, instead of a silicon chip, a germanium chip, or chip of other suitable semiconductor material, can be used.

Obviously many other modifications and variations of the present invention are possible in the light of the above teachings. It is therefore to be understood that within the scope of the appended claims the invention can be practiced otherwise than as specifically described.

What is claimed is:

1. A field effect transistor which comprises: semiconductor material having adjacent a surface thereof first and second interdigitated areas of one conductivity type separated by a channel area of opposite conductivity type; and a metal gate overlying and insulated from substantial interdigitated portions of the first and second areas and the intervening channel area.

2. A field effect transistor according to claim 1 wherein the first and second areas comprise interdigitated fingers of tapered form in which the width of the fingers decreases toward the ends of the fingers.

3. A field effect transistor according to claim 1 and comprising first and second metal electrodes connected to the respective first and second areas and spaced from the metal gate.

4. A metal-oxide-semiconductor field effect transistor which comprises a plurality of tapered source fingers of doped semiconductor material deposited upon a semiconductor substrate of doping opposite to that of the source fingers, a plurality of tapered drain fingers of doping similar to that of the source fingers interdigitated with the source fingers and deposited upon the substrate, said source and drain fingers being spaced from each other, and a metal film gate insulated from the source and drain areas deposited over the entire area of the interdigitated source and drain fingers.

5. A metal-oxide-semiconductor field effect transistor which comprises a plurality of source fingers of N doped semiconductor material deposited upon a P doped semiconductor substrate, a plurality of drain fingers of N doped semiconductor material interdigitated with the source fingers and deposited upon the P doped semiconductor substrate, said source and drain fingers being spaced from each other and a metal film gate insulated from the source and drain areas deposited over the entire area of the interdigitated source and drain fingers.

6. A metal-oxide-semiconductor field effect transistor according to claim 5, wherein the semiconductor material of the source and drain areas and of the substrate is silicon.

7. A metal-oxide-semiconductor field effect transistor according to claim 5, wherein the semiconductor material of the source and drain areas and of the substrate is germanium.

8. A metal oxide-semiconductor field effect transistor which comprises a plurality of source fingers of P doped semiconductor material deposited upon a N doped semiconductor substrate, a plurality of drain fingers of P doped semiconductor material interdigitated with the source fingers and deposited upon the N doped semiconductor substrate, said source and drain fingers being spaced from each other and a metal film gate insulated from the source and drain areas deposited over the entire area of the interdigitated source and drain fingers.

9. A metal-oxide-semiconductor field effect transistor according to claim 8, wherein the semiconductor material of the source and drain areas and of the substrate is silicon.

10. A metal-oxide-semiconductor field effect transistor according to claim 8, wherein the semiconductor material of the source and drain areas and of the substrate is germanium.

References Cited

UNITED STATES PATENTS

| | | | |
|---|---|---|---|
| 3,056,888 | 10/1962 | Atalia | 307—88.5 |
| 3,258,663 | 6/1966 | Weimer | 317—235 |
| 3,268,827 | 8/1966 | Carlson et al. | 330—18 |
| 3,293,512 | 12/1966 | Simmons et al. | 317—235 |

JOHN W. HUCKERT, *Primary Examiner.*

R. SANDLER, *Assistant Examiner.*